(12) United States Patent
Srinivasan et al.

(10) Patent No.: US 6,423,626 B1
(45) Date of Patent: Jul. 23, 2002

(54) REMOVAL OF METAL CUSP FOR IMPROVED CONTACT FILL

(75) Inventors: Anand Srinivasan; Gurtej Sandhu; Sujit Sharan, all of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/334,753

(22) Filed: Jun. 16, 1999

Related U.S. Application Data

(62) Division of application No. 09/184,489, filed on Nov. 2, 1998, now Pat. No. 5,963,832.

(51) Int. Cl.⁷ .......................................... H01L 21/4763
(52) U.S. Cl. ...................... 438/618; 438/672; 438/685
(58) Field of Search .................. 438/672, 685, 438/754, 691, 692, 620–622, 625, 626, 627, 628, 629, 631, 633, 634, 695, 618

(56) References Cited

U.S. PATENT DOCUMENTS

| | | |
|---|---|---|
| 4,595,452 A | 6/1986 | Landau et al. |
| 4,666,737 A | 5/1987 | Gimpelson et al. |
| 4,792,842 A | 12/1988 | Honma et al. |
| 4,874,719 A | 10/1989 | Kurosawa |
| 4,963,511 A | 10/1990 | Smith |

(List continued on next page.)

FOREIGN PATENT DOCUMENTS

| | | |
|---|---|---|
| EP | 0 297 502 A2 | 1/1989 |
| EP | 0 297 502 A3 | 5/1989 |
| EP | 0 661 736 A1 | 5/1995 |
| JP | 0 071 150 | 3/1989 |
| JP | 405152292 A | 6/1993 |

OTHER PUBLICATIONS

Honma et al.: "Planarization Mechanism of RF–Biased AI Sputtering", Journal of the Electrochemical Society, vol. 140, No. 3, Mar. 1, 1993, pp 855–860, XP000378165.
Reliable Tungsten Chemical Vapor Deposition Process with Sputter Etch to Form contact Studs:, 700 IBM Technical Disclosure bulleting, vol. 30, No. 10, Mar. 1988, pp. 162/163 XP000111112.
"Contact Stud Fabrication Process using Dual Ion–Bean Deposition and Etch", IBM Technical Disclosure Bulletin, vol. 29, No. 8, Jan. 1987, p 3403–3404.

Primary Examiner—Olik Chaudhuri
Assistant Examiner—Ginette Peralta
(74) Attorney, Agent, or Firm—Knobbe Martens Olson & Bear LLP (57) ABSTRACT

Disclosed is a method for providing improved step coverage of contacts with conductive materials, and particularly metals. An initial conductive layer is deposited over an insulating layer either before or after contact opening formation. The deposition process tends to block the contact mouth with a metal overhang, or cusp. After both conductive layer deposition and contact formation a portion of the initial conductive layer is removed, thus removing at least a portion of the metal cusp and opening the contact mouth for further depositions. The invention has particular utility in connection with formation of metal plugs in high-aspect ratio contacts. Embodiments are disclosed wherein the cusp removal comprises mechanical planarization, etching with high viscosity chemicals, and facet etching.

12 Claims, 9 Drawing Sheets

U.S. PATENT DOCUMENTS

| | | |
|---|---|---|
| 5,066,611 A | 11/1991 | Yu |
| 5,106,779 A | 4/1992 | Yu |
| 5,124,780 A | 6/1992 | Sandhu et al. |
| 5,147,819 A | 9/1992 | Yu et al. |
| 5,166,093 A | 11/1992 | Grief |
| 5,169,491 A | 12/1992 | Doan |
| 5,225,034 A | 7/1993 | Yu et al. |
| 5,278,100 A | 1/1994 | Doan et al. |
| 5,309,023 A | 5/1994 | Motonani et al. |
| 5,354,490 A | 10/1994 | Yu et al. |
| 5,362,666 A | 11/1994 | Dennison |
| 5,376,405 A | 12/1994 | Doan et al. |
| 5,385,867 A | 1/1995 | Ueda et al. |
| 5,387,550 A | 2/1995 | Cheffings et al. |
| 5,416,048 A | 5/1995 | Blalock et al. |
| 5,420,074 A | 5/1995 | Ohshima |
| 5,444,013 A | 8/1995 | Akram et al. |
| 5,545,584 A | 8/1996 | Wuu et al. |
| 5,580,821 A | 12/1996 | Mathews et al. |
| 5,644,166 A | 7/1997 | Honeycutt et al. |
| 5,654,233 A * | 8/1997 | Yu .......................... 438/643 |
| 5,654,234 A | 8/1997 | Shih et al. |
| 5,730,835 A * | 3/1998 | Roberts et al. .......... 156/656.1 |
| 5,833,817 A | 11/1998 | Tsai et al. |
| 5,942,449 A * | 8/1999 | Meikle ....................... 438/747 |
| 5,970,374 A * | 10/1999 | Teo ............................ 438/629 |

\* cited by examiner

REMOVAL OF METAL CUSP FOR IMPROVED CONTACT FILL

REFERENCE TO RELATED APPLICATION

This is a divisional application of application Ser. No. 09/184,489, filed Nov. 2, 1998 now U.S. Pat. No. 5,963,832.

FIELD OF THE INVENTION

The present invention relates to the deposition of conductive layers into contacts to semiconductor substrates, and more particularly to eliminating the formation of voids in filling metal-to-substrate contacts within integrated circuits.

BACKGROUND AND SUMMARY OF THE INVENTION

Multiple line and device levels in an integrated circuit are typically separated by insulating dielectric layers. Contact holes, more simply referred to as "contacts," are formed through the insulating layers to provide electrical contact between two or more conductive layers. The insulating layers must be grown or deposited to a minimum thickness. Too thin an insulating layer results in an intolerably high interlevel capacitance, which ties up otherwise available conduction carriers. Thus, as dimensions continue to be scaled down to the submicron level, the contact opening shrinks in size but the depth of the contact (through an insulating layer) must remain the same. In other words, the aspect ratio of contact openings increases as circuitry becomes more densely packed.

Figure 1:
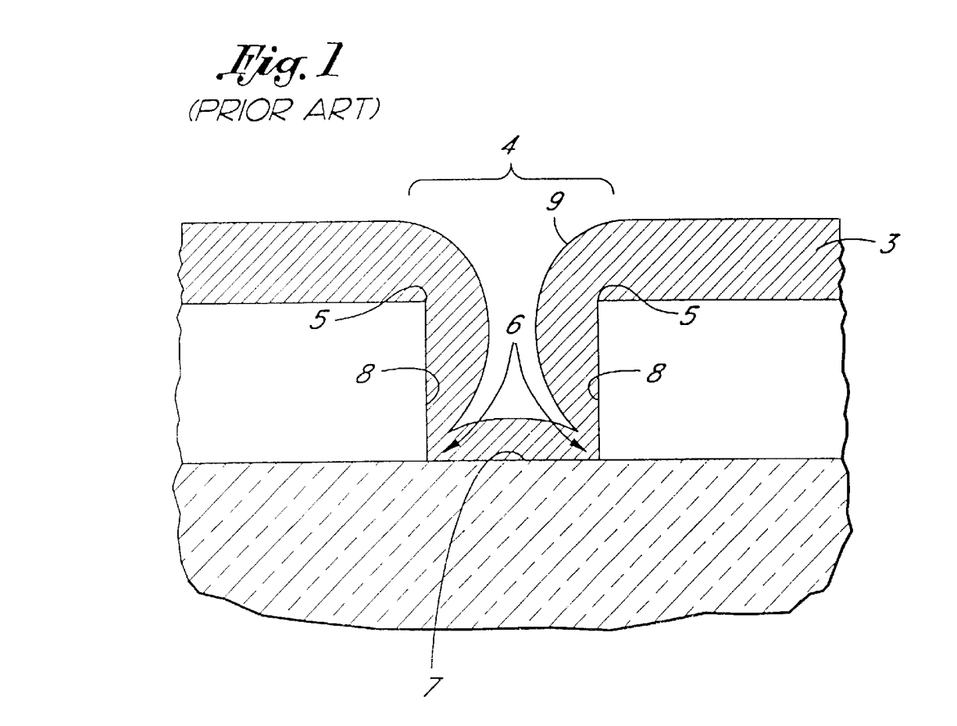
FIG. 1 is a schematic, partial sectional view of a prior art integrated circuit, showing a metal-to-metal contact.

FIG. 1 illustrates a prior art conductive layer 3 deposited into a contact opening 4 to provide the metal-to-metal interlevel electrical contact. It should be understood that FIG. 1 is a schematic cross-sectional view, omitting the back wall for simplicity, but that the contact 4 is ordinarily etched in the shape of a cylinder. Unfortunately, physical vapor deposition of the conductive layer 3, such as metal evaporation or sputtering, produces poor step coverage into narrow contact openings having high-aspect ratios. During a metal sputter deposition, for example, metal builds quickly on a lip 5 of the contact 4.

Quick build-up of sputtered metal on the lip 5 of the contact 4, and the resultant poor step coverage, is produced in part and compounded by a shadow effect at a vertical sidewall 8. The faster deposition of metal on the contact lip 5 creates a cusp 9 into the mouth of the contact 4, sheltering the lower portions and thus even further slowing down deposition in the lower corner 6 of the contact 4. Eventually, the metal may pinch off at the contact mouth before significant metal is deposited in the lower corner 6. Where the contact has an aspect ratio of 1.0 or greater (contact height is equal to or greater than the diameter of the opening) the deposited metal is especially susceptible to pinching off and closing the contact. Voids or "keyholes" are thus created in filling the contact. As integrated circuits become more dense and the aspect ratios of metal-to-metal contacts continue to increase over 1.0 (1:1), the shadow effect becomes more pronounced.

Figure 1A:
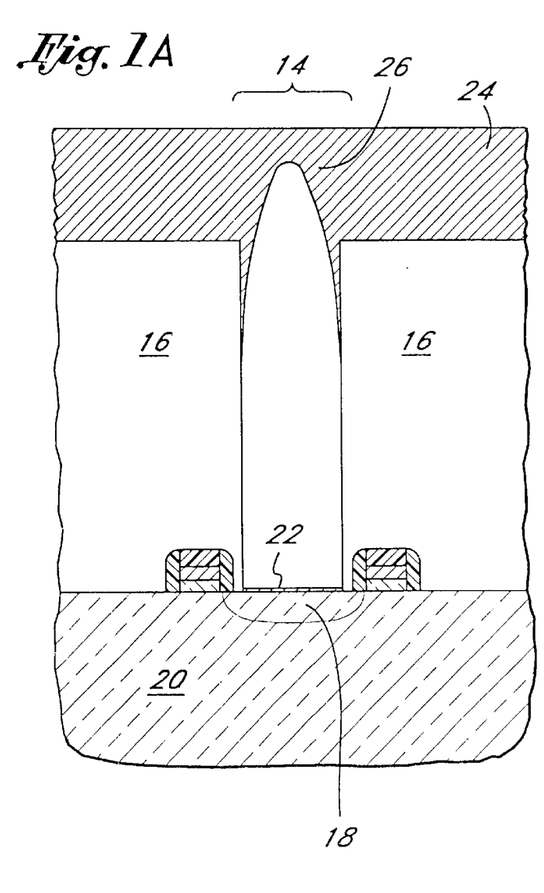
FIG. 1A is a schematic, sectional view of a partially fabricated metal-to-substrate contact in an integrated circuit, with the contact mouth pinched off by a sputtered metal.

FIG. 1A illustrates a contact made through an insulating layer 16 down to an active area 18 of a semiconductor substrate 20. Such contacts are typically even deeper and more narrow than metal-to-metal contacts such as that illustrated in FIG. 1. The insulating layer 16 (e.g., BPSG) is usually very thick in order to provide electrical isolation of underlying devices such as capacitors and transistors. Contacts to the substrate in dynamic random access memory (DRAM) cells are particularly deep, as the contact height is dictated by the height of adjacent cell capacitors. DRAM capacitors, in turn, are designed increasingly taller in order to provide adequate surface area for cell capacitance, despite shrinking available real estate.

At the same time, the active areas 18 to which contact must be made are constantly growing more narrow with each new generation of semiconductor chip, often confined between gate electrodes or word lines of a memory circuit, for example. Accordingly, metal-to-substrate contacts may range in aspect ratio from about 2:1 to 8:1.

Traditionally, contacts through thick insulating layers to silicon substrates have been filled with a conductive plug which is deposited by chemical vapor deposition ("CVD"). The most common material used for this purpose is tungsten (W), for which CVD methods are well-developed, resulting in conformal deposition and filling of the contact without keyholes. At the same time, use of tungsten plugs for direct contact with silicon substrates presents a number of problems. Most of these problems may be addressed by first depositing an initial conductive layer within the contact prior to depositing the tungsten. The material typically used for this layer is titanium, though other suitable materials are known.

The titanium serves several purposes. In the first place, the titanium at the surface of the silicon may be annealed to form a silicide ($TiSi_2$ in its stoichiometric form) over the substrate surface. This significantly reduces the contact resistance between the active area and the tungsten plug through a better matching of energy levels. The process of forming the silicide (referred to as "silicidation"), further reduces contact resistance by breaking up native oxide ($SiO_2$), an insulator which naturally forms at the silicon surface after the contact is opened. The layer of silicide also serves to prevent direct contact between the silicon substrate and tungsten, since tungsten tends to poison the substrate and interfere with electrical operations of transistors and other integrated devices. Furthermore, any titanium on the sidewalls of the contact improves adhesion, since CVD tungsten adheres poorly to the insulating layers, such as borophosphosilicate glass ("BPSG"), in which the contact is formed.

Unfortunately, titanium and many other appropriate metals are generally deposited by physical vapor deposition ("PVD") or sputtering. As with the metal-to-metal contact 4 illustrated in FIG. 1, contacts to the substrate 20 also tend to form keyholes or voids during the initial PVD.

FIG. 1A illustrates the complete blockage of the metal-to-substrate contact 14 caused by titanium (or other PVD metal) deposition. The active area 18 represents the bottom of the contact 14. In order to form a titanium substrate coating 22 of even 100 Å at the bottom of the contact 14, a layer 24 often as thick as 1,300 Å to 1,500 Å must be deposited over the insulating layer 16. For higher aspect ratios of future generation circuits, even more titanium must be deposited for sufficient coverage of the bottom.

The small percentage of metal reaching the active area or substrate surface 18 is due to the natural tendency of PVD to more quickly grow at the corner of the contact hole than elsewhere, forming a metal cusp 26 which extends into the contact opening and eventually pinches it off. In the example illustrated in FIG. 1A the thick titanium layer 24 causes the titanium cusp 26 to pinch off, closing the mouth of the contact before enough titanium has reached the substrate. The substrate coating 22 is thus too thin. Furthermore, the contact 14 must be still be filled with further materials, such as the conventional tungsten plug, even though the contact 14 has been closed off.

Figure 2:
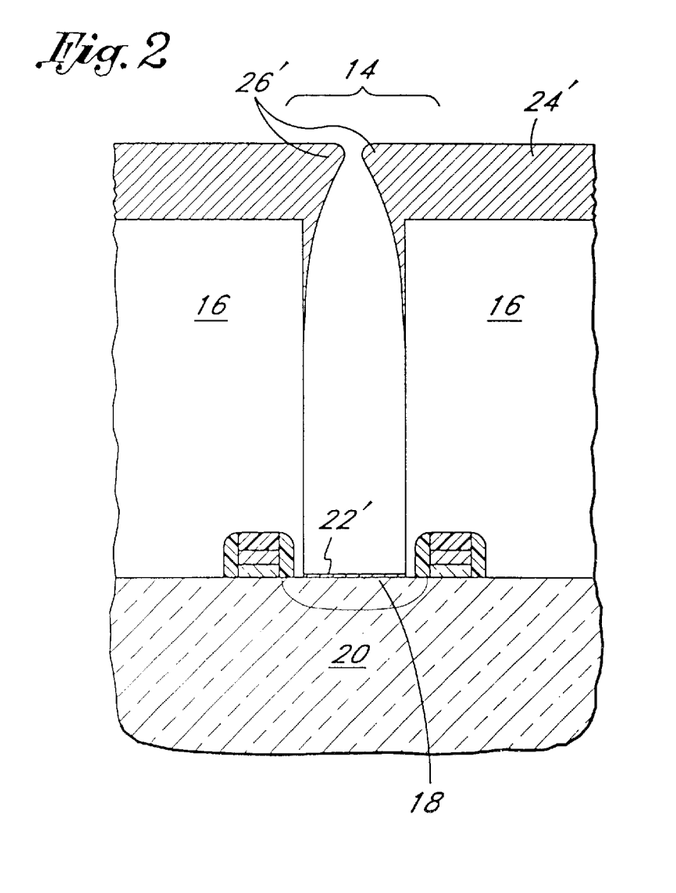
FIG. 2 is a schematic, sectional view of a partially fabricated metal-to-substrate contact, like that illustrated in FIG. 1A, but having a small opening through a metal cusp.
Figure 3:
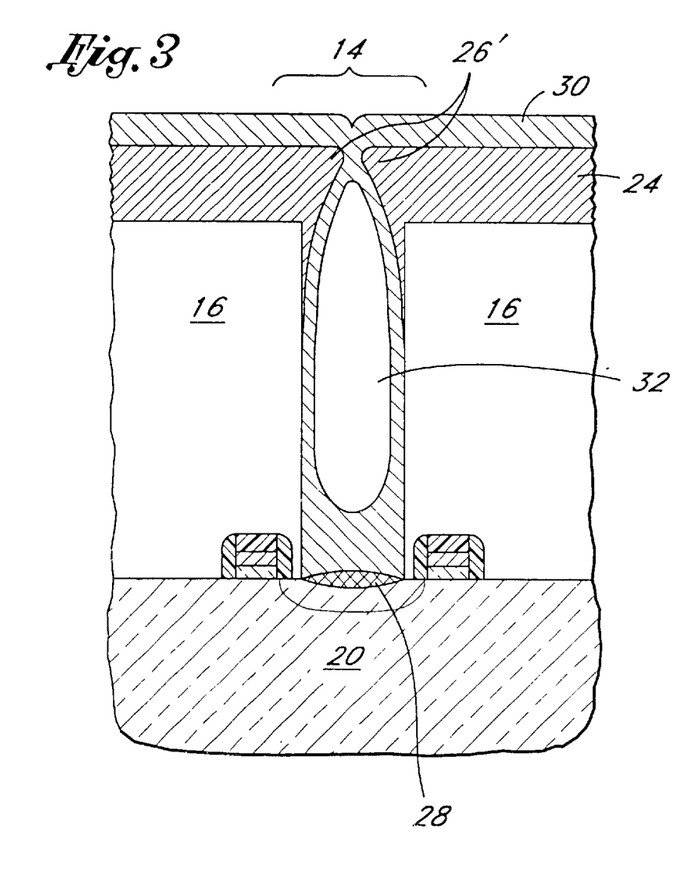
FIG. 3 illustrates the result of a CVD metal deposition into the contact of FIG. 2.

FIGS. 2 and 3 illustrate that, even where the contact 14 is not completely pinched off during deposition of the titanium 22' and 24', the metal cusp 26' is problematic during later contact fill steps. FIG. 3 shows the result of a deposition of a CVD tungsten layer 30 and a silicidation step, forming a silicide layer over the substrate surface 18. Although CVD tungsten is generally much more conformal than the PVD titanium 24'. Nevertheless, even the CVD tungsten layer 30 cannot completely fill the contact 14 with such a large cusp 26' shadowing the contact 14, and certainly not if the contact 14 is completely closed off (FIG. 1A). A large void 32 thus forms within the plug, reducing the effective size of current flow path for the operational circuit. As aspect ratios of such contacts continually increase with each new generation of microchip, the risk of pinching off the contact opening increases in turn.

One method of improving step coverage of a PVD metal involves a process of sloping the sidewall of the contact, thus opening the contact in a tapered or cone shape. The minimum diameter of the bottom of the contact, however, is still limited by photolithographic resolution. Sloping the contact sidewall thus increases the total area occupied by the contact and reduces the allowable packing density. Such decreases in packing density are unacceptable in the face of current commercial requirements for the miniaturization of integrated circuits.

A need thus remains for an efficient method of filling high-aspect ratio contacts with conductive plugs for forming electrical contact with silicon substrates. Advantageously, such a method would also be compatible with conventional physical deposition techniques to allow use of a wide array of metals, including sputtered titanium.

According to one aspect of the invention, a method is provided for forming a conductive plug to contact a semiconductor substrate of an integrated circuit. The method comprises forming an insulating layer; forming a contact through the insulating layer to expose an active area of the substrate; depositing a first conductive layer over the insulating layer and into the contact; at least partially remolding the cusp; and filling the contact with a CVD conductive layer.

According to another aspect of the invention, a method is provided for forming electrical contact between layers in an integrated circuit. The method comprises opening a contact through an insulating layer to expose a circuit element; depositing an initial conductive layer to form direct contact with a top surface of the insulating layer and the exposed circuit element; and removing a top portion of the initial conductive layer overlying the top surface of the insulating layer.

According to yet another aspect of the invention, a method is provided for forming electrical contact through an insulating layer to a semiconductor substrate. The method comprises etching a contact with an aspect ratio of greater than about 2:1 through the insulating layer to the substrate; depositing a metal layer over the insulating layer and into the contact, forming a metal cusp at a lip of the contact; at least partially removing the metal cusp; and depositing a second conductive layer into the contact.

According to still another aspect of the invention, a method is provided for forming a conductive plug to contact a semiconductor substrate of an integrated circuit. The method comprises forming a contact through an insulating layer, to expose an active area of the substrate; depositing a titanium layer over the insulating layer and into the contact; at least partially removing a titanium cusp shadowing the contact; annealing the titanium to form a silicide protective layer over the active area; and depositing a tungsten filler into the contact.

According to still another aspect of the invention, a method is provided for filling a contact through an insulating layer in an integrated circuit. The method comprises depositing an initial conductive layer into the contact and over the insulating layer; mechanically planarizing a top portion of the initial conductive layer; and filling the contact with a second conductive layer after planarizing the top portion.

According to still another aspect of the invention, a method is provided for forming a conductive contact in an integrated circuit. The method comprises forming a contact hole through an insulating layer; forming an initial conductive layer at the bottom of the contact and a top layer over the insulating layer; inverting the structure over an absorbent pad soaked With a viscous etchant to etch the top layer; and depositing a second conductive material into the contact hole after etching the top layer.

According to still another aspect of the invention, an integrated circuit with a contact plug in electrical contact with a semiconductor substrate is disclosed. The circuit comprises an insulating layer with a contact defined by a sidewall and a bottom surface, characterized by an aspect ratio greater than about 2:1; a first metallic layer at least partially lining the contact sidewall; and a conductive filler filling the contact; and a silicide layer interposed between the substrate and the conductive material.

Further aspects of the invention will be clear, in light of the disclosure herein, to one having skill in the art of integrated circuit fabrication.

DETAILED DESCRIPTION OF THE PREFERRED EMBODIMENT

The present description of the preferred embodiments focuses on contacts between an interconnect layer to be formed and active areas within a silicon substrate, and further focuses on the structure and processes of forming a tungsten plug. However, it will be understood by those skilled in the art of integrated circuit fabrication that aspects of the invention may be applied to filling contacts between any two levels in an integrated circuit. For example, the invention may be applied to intermetal contacts, such as that illustrated in prior art FIG. 1. Furthermore, the skilled artisan will also find application for the present invention wherever good step coverage is desired for a conformal layer in a high-aspect ratio contact.

Contacts to a silicon substrate, however, are typically much deeper than metal-to-metal contacts. Insulating layers, such as BPSG, are usually very thick in order to provide electrical isolation of devices such as capacitors and transistors. Additionally, the preferred embodiments described herein are implemented in the context of a dynamic random access memory ("DRAM"). DRAM capacitors, in the form of conductively lined containers on one side of a transistor, may be extremely tall in order to provide high surface area electrodes. At the same time, the active areas to which contact must be made are constantly growing more narrow with each new generation of semiconductor chip. Accordingly, contacts made to silicon substrates, which are adjacent the DRAM capacitors, may range in aspect ratio from about 2:1 to 8:1 and will be even higher for future generation circuits. The contacts are therefore more difficult to conformally fill than are intermetal contacts. The contacts of the embodiments described below most preferably range in aspect ratio from about 4:1 to 6:1.

As mentioned in the "Background" section above, such high-aspect ratio contacts to the substrate are often filled with a CVD conductive material, such as tungsten. Prior to filling the contact, however, at least one initial conductive layer is often first deposited for improved contact resistance or diffusion barrier qualities.

Figure 4:
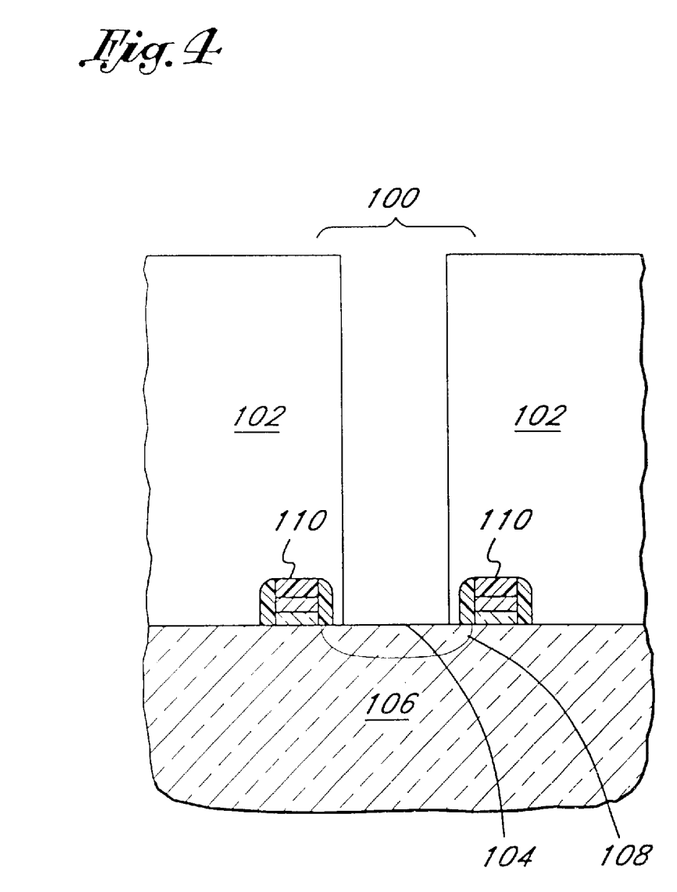
FIG. 4 is a schematic, partial sectional view of an integrated circuit having a contact opening etched through an insulating layer to expose an active area of a semiconductor substrate, in accordance with a processing stage of the preferred embodiments of the present invention.

FIG. 4 represents a starting point for the preferred embodiments of the present invention. A contact 100 has been opened through a relatively thick insulating layer 102. (It will be understood that the contact 100 generally conforms to a cylindrical shape with a circular shape at the top of the cylindrical opening.) The drawings show a cross-sectional view of the contact 100, wherein the back wall is omitted from the views for simplicity. The insulating layer 102, which provides electrical isolation for the underlying devices, has a thickness between about 1.0 μm (micron) and 3.0 μm, and more preferably between about 1.5 μm and 2.0 μm. The insulating layer 102 may comprise any suitable dielectric material, but most preferably comprises borophosphosilicate glass ("BPSG").

The contact 100 extends down to a surface 104 of a semiconductor substrate 106, which preferably comprises monocrystalline silicon. It will be understood by one of skill in the art of semiconductor processing, however, that the "substrate" in alternative embodiments may comprise other forms of semiconductor layers which include active or operable portions of semiconductor devices. The embodiment illustrated in FIG. 4 includes an active area 108 defined in the substrate 106 between two gate electrodes 110. Such an active area may serve as the source or drain of a transistor in a dynamic random access memory (DRAM) chip, for example.

As the dimensions in integrated circuits continue to be scaled down, the separation between the gates 110 continues to shrink. The separation between gates 110 defines the active area 108, and the active area 108, in turn, defines the (maximum) width of the contact 100. The width of the preferred contact may range from about 0.2 μm to 0.8 μm, and most preferably about 0.35 μm, although the contacts of future generations may be even more narrow. Accordingly, the contact 100 should have an aspect ratio between about 2:1 and 8:1. Preferably, the aspect ratio is greater than about 4:1 and most preferably greater than about 6:1.

Figure 5:
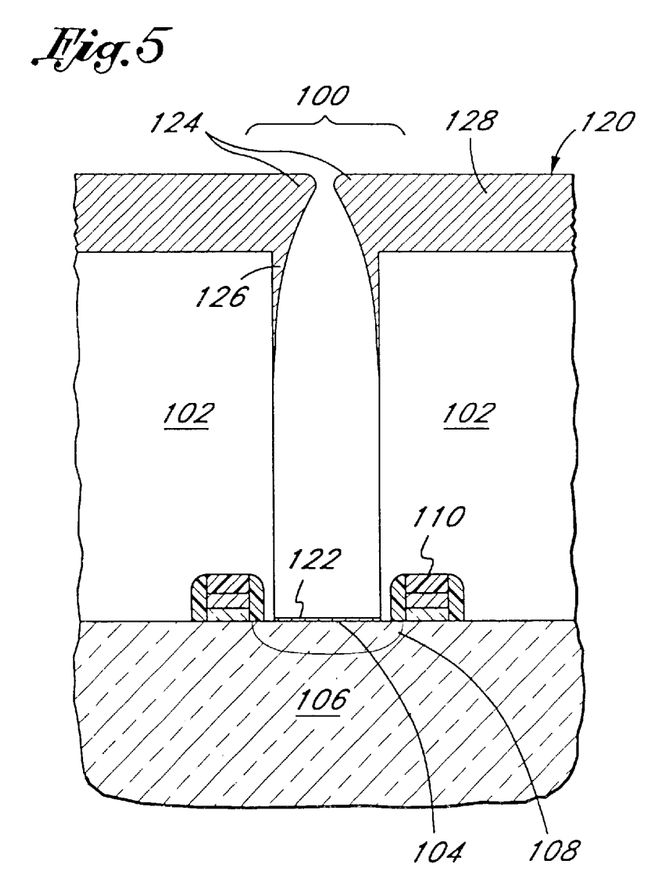
FIG. 5 illustrates the contact of FIG. 4 after an initial PVD metal layer has been deposited over the wafer.

Referring now to FIG. 5, an initial conductive layer 120 has been formed over the insulating layer 102 and into the contact 100. Preferably, the conductive layer 120 comprises a metal which forms a stable, low-resistance silicide when reacted with silicon. Examples including refractory metals such as titanium, cobalt, tantalum, molybdenum, rhenium, and combinations of such metals. The conductive layer 120 of the preferred embodiments comprises titanium. A bottom layer or substrate coating 122 of at least about 100 Å of titanium should be formed at the substrate surface 104, at the bottom of the contact 100, and more preferably between about 500 Å and 2,000 Å.

Generally, the conductive layer 120 is formed by a physical vapor deposition ("PVD"), or sputtering. As discussed in the "Background" section above, PVD methods are especially prone to formation of a metal cusp 124 or overhang at the opening of the contact 100.

Even if this cusp 124 does not actually pinch off and close the contact 100, it will at the very least reduce the diameter of the opening and consequently slow the rate of deposit for the bottom portion or substrate coating 122. The shadow effect of PVD methods results in a quickly tapering sidewall portion 126 of the layer 120. In order to achieve the required thickness of the substrate coating 122, the preferred titanium layer 120 will range in thickness at a top layer 128 (overlying the insulating layer 102) of between about 1,000 Å and 3,000 Å, more preferably between about 1,300 Å and 1,500 Å. As illustrated in FIG. 3 and discussed above, the cusp 124 would ordinarily lead to reliability problems during subsequent deposition steps in the process.

Accordingly, the initial conductive layer 120 comprises the substrate coating 122, the sidewall portion 126, and the top layer 128. The formation of the conductive layer 120 is followed by the contact fill step, whereby a conductive plug is formed. Prior to the contact fill, however, the preferred embodiments include some form of a cusp removal step for widening the contact opening and facilitating the later fill step.

Figure 6:
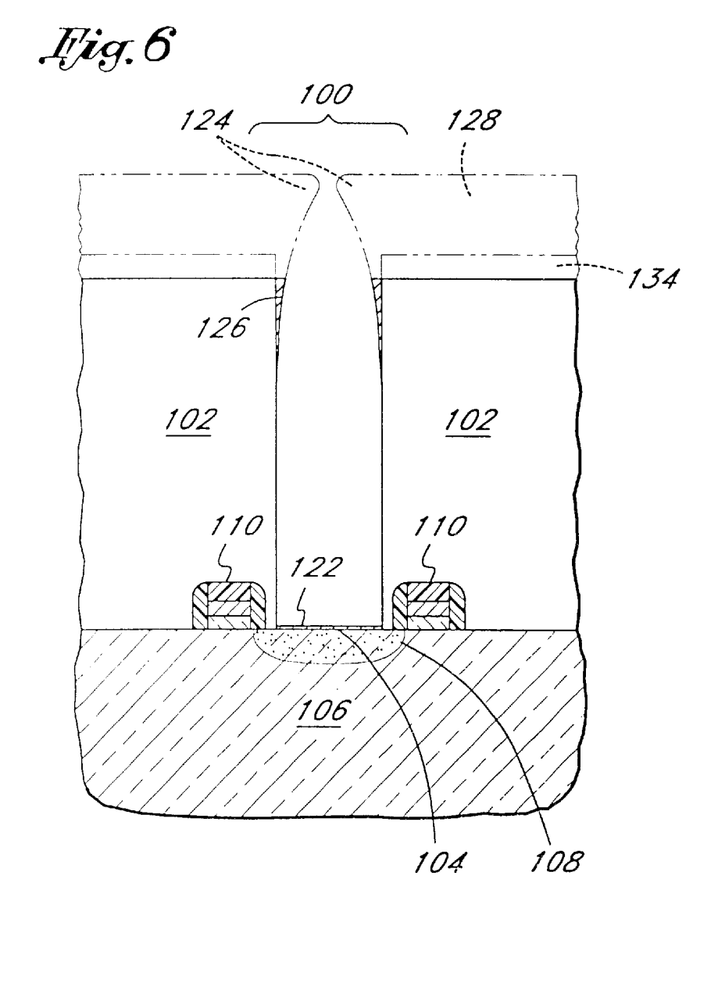
FIG. 6 illustrates the contact of FIG. 5 after a cusp removal in accordance with a first preferred embodiment of the present invention.
Figure 7:
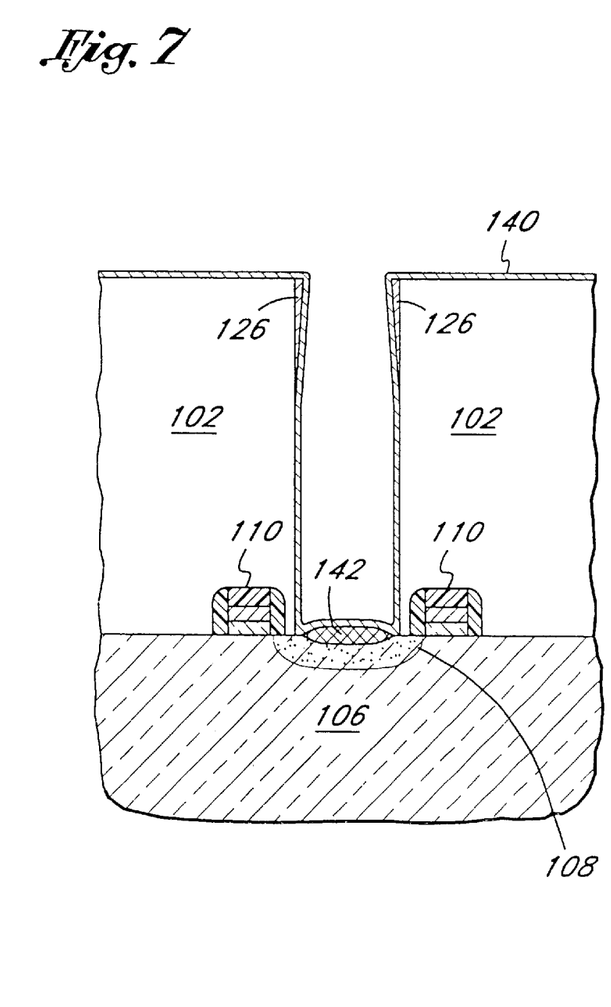
FIG. 7 illustrates the contact of FIG. 6 after depositing a barrier layer.
Figure 8:
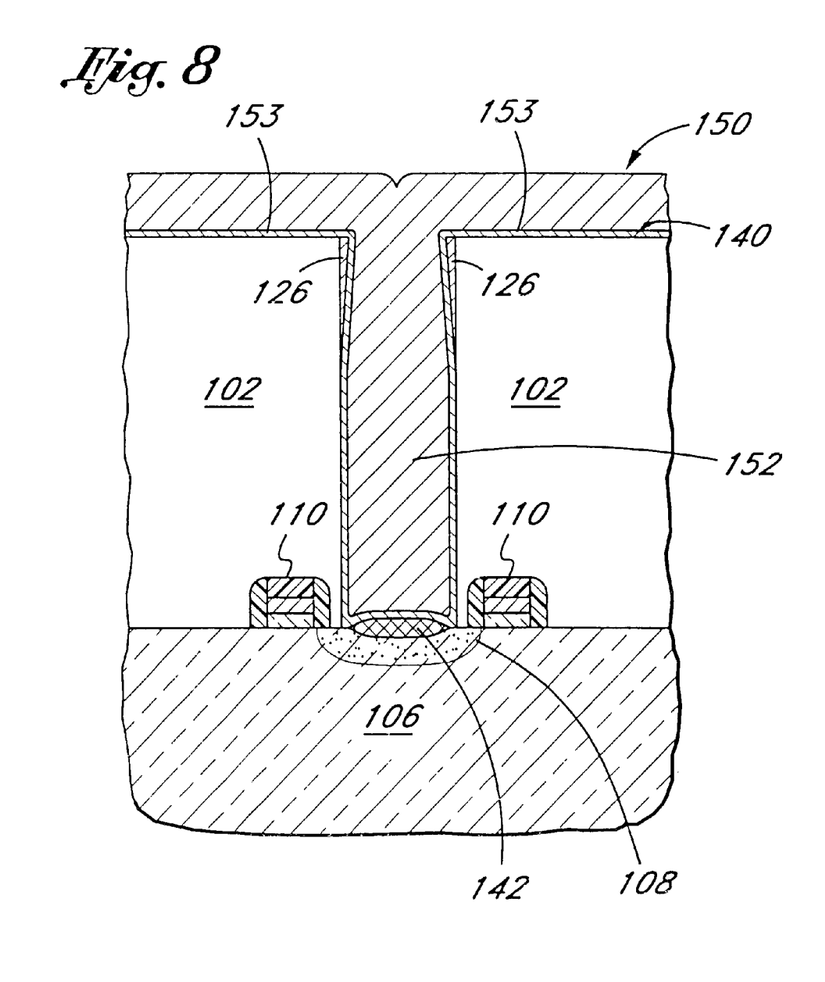
FIG. 8 illustrates the contact of FIG. 7 after a contact fill.

FIGS. 6 through 8 generally illustrate steps of a first preferred embodiment, whereby the cusp removal step comprises planarizing a top portion 128 of the conductive layer 120 by mechanical abrasion. Such mechanical abrasion preferably comprises a standard chemical-mechanical planarization (CMP) step, utilizing a chemically active slurry to aid the mechanical action of a polishing pad. Most preferably, the slurry comprises a silica-based composition. In light of the present disclosure, however, the skilled artisan may adapt alternative mechanical abrasion processes to planarize the top layer 128 of the conductive layer 120. By mechanically removing the top portion 128 the cusp 124 is at least partially removed, thus widening the contact opening prior to the next deposition.

FIG. 6 illustrates the result of the cusp removal step of the first preferred embodiment. A least a top portion of the top layer 128 is removed. Preferably, the entire top layer 128 overlying the insulating layer 102 is removed, though less than complete removal of the top portion 128 may still be advantageous in widening the contact opening. An upper portion 134 of the insulating layer 102 is preferably also removed, since the preferred mechanical abrasion may also abrade BPSG or any other chosen insulating material.

Referring now to FIG. 7, a barrier layer 140 is deposited and silicide layer 142 has been formed by an anneal step. The anneal preferably comprises heating the structure at between about 600° C. and 900° C., more preferably between about 700° C. and 750° C. for a period between about 20 seconds and 10 minutes. A post-silicidation anneal may also be performed at any time before completion of the integrated circuit. The second anneal, which converts the silicide 142 from the C49 phase to a lower resistance C4 phase, is preferably conducted at between about 650° C. and 800° C.

The barrier layer 140 may comprise any dense and conductive material, and most preferably comprises titanium nitride deposited by CVD. It will be understood that the barrier layer 140 is not necessary to achieve the advantages of the cusp removal disclosed herein. However, it is preferred in order to prevent later-deposited tungsten of the preferred embodiment from diffusing to the active area 104. The barrier layer 140 may also be deposited prior to the mechanical abrasion of the first preferred embodiment. However, the preferred sequence is to deposit the barrier layer 140 after the cusp removal step, since this sequence ensures a better coating of the contact walls after the opening of the contact 100 is widened by the cusp removal step.

Referring now to FIG. 8, a contact fill step, comprising the deposition of a filler material 150, results in a conductive plug 152 filling the contact 14. The filler material 150 may comprise any conductive material for which conformal deposition processes are available. For example, CVD processes are known for tungsten (W), aluminum (Al), and copper (Cu). Other examples include PVD Al, which is forced into the contact at high pressure and temperature (e.g., 600 atm. and 450–500° C.) after deposition. Most preferably, tungsten is deposited by a known CVD process. As a result of the previous cusp removal step, the conductive plug 152 is less likely to form troublesome voids.

As FIG. 8 illustrates, the resulting structure may include the barrier layer 140 in direct contact with an upper surface 153 of the insulating layer 102, while the titanium sidewall portion 126 is partially interposed between the filler 150 and the insulating layer 102 within the contact 100. It will be understood that in other embodiments without the barrier layer, the filler material may directly contact the upper surface of the insulating layer. Alternatively, the CMP may leave a small amount of the initial conductive layer (e.g., titanium) over the upper surface of the insulating layer.

FIGS. 9–13 generally illustrate steps of a second preferred embodiment, whereby a viscous etchant at least partially removes the metal cusp 124 generated by the PVD step.

Figure 9:
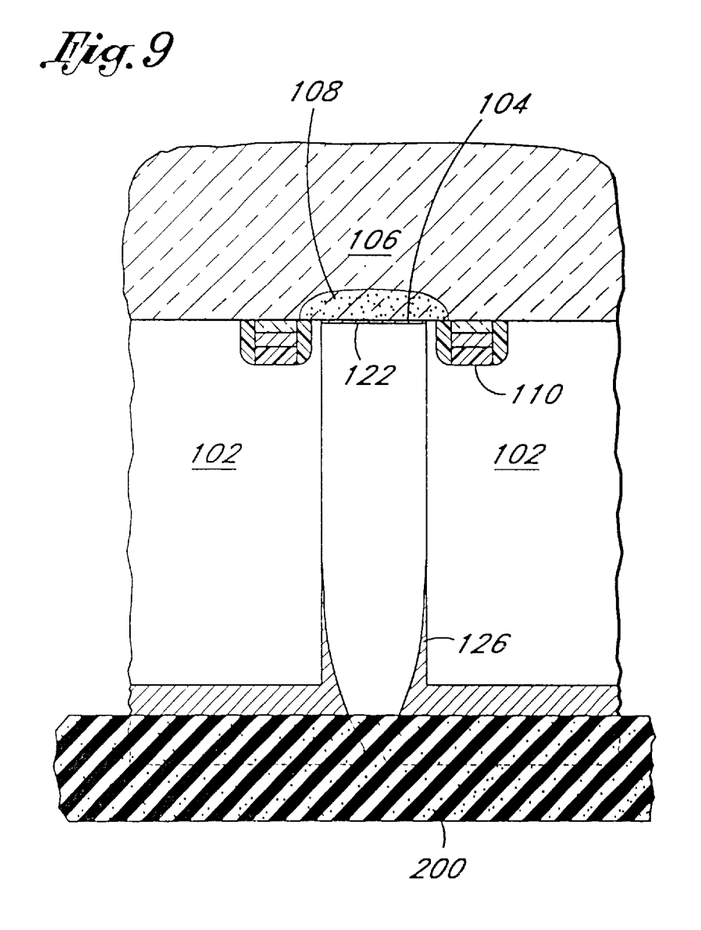
FIG. 9 illustrates the contact of FIG. 5, with the partially processed circuit inverted over a pad containing a viscous etchant, in accordance with a second preferred embodiment of the present invention.

As shown in FIG. 9, the wafer of FIG. 5 is first inverted over an absorbent pad 200, which pad contains a viscous etchant. By "viscous," the present description means to encompass those etchants with a viscosity higher than about 1.0 mPa-s, and more preferably in the range of about 2 mPa-s to 5 mPa-s. Most preferably the etchant comprises a solution of between about 30% and 60% phosphoric acid, more preferably between about 40% and 50%. Such concentration of phosphoric acid should yield a viscosity between about 2.5 mPa-s and 3 mPa-s.

Such viscosity generally permits enough etchant flow to etch the surface of the conductive layer 120 in direct contact with the pad 200. However, the viscosity is not so low as to flow into the contact (through capillary action, for example) and etch the substrate coating 122 or silicide 142, depending upon when the silicidation anneal is carried out.

Figure 10:
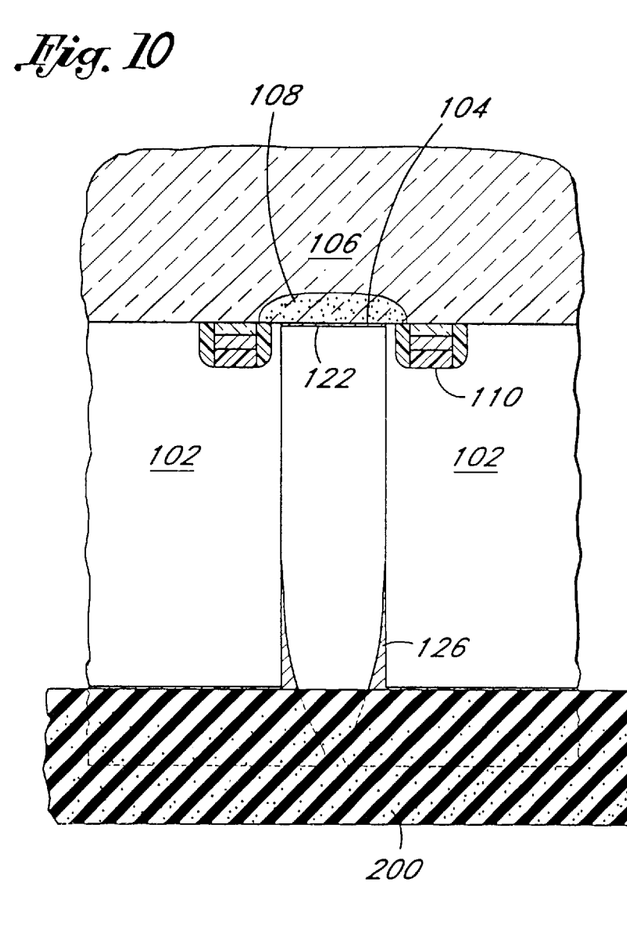
FIG. 10 illustrates the contact of FIG. 9 after the PVD metal layer has been partially etched.
Figure 11:
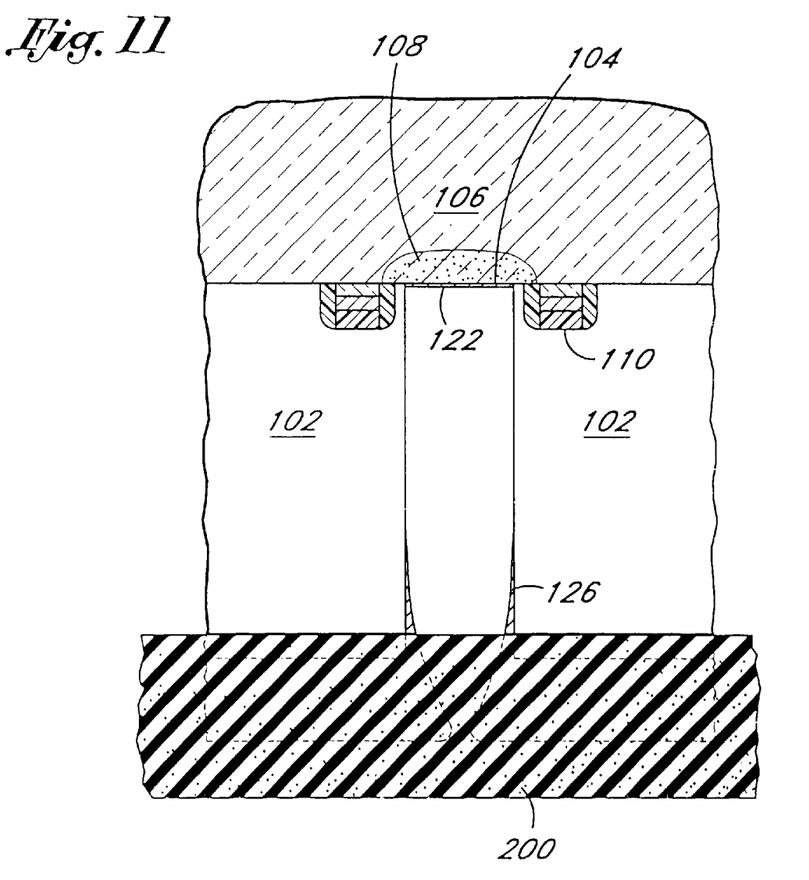
FIG. 11 illustrates the contact of FIG. 10 after further etching.

As illustrated in the successive FIGS. 10 and 11, only the top portion 128 of the initial conductive layer 120, which is in contact with the pad 200, is etched. The titanium coating of the sidewall portion 126 and the substrate coating 122 remains unharmed in FIG. 10. The temperature during the etch step may range from 0° C. to 100° C. for phosphoric acid, though different temperature ranges may be appropriate depending upon the material characteristics of the chosen etchant.

FIG. 11 illustrates the result of leaving the wafer inverted over the pad 200 long enough to etch all the titanium overlying the insulating layer 102. For the preferred initial conductive layer 120, this may require less than about 10 minutes, preferably between about 2 minutes and 5 minutes. Here, the sidewall portion 126 of the initial conductive layer 128 is also partially etched. After the etch step is complete, the wafer may be removed from the pad 200 and rinsed of excess etchant in deionized water.

Figure 12:
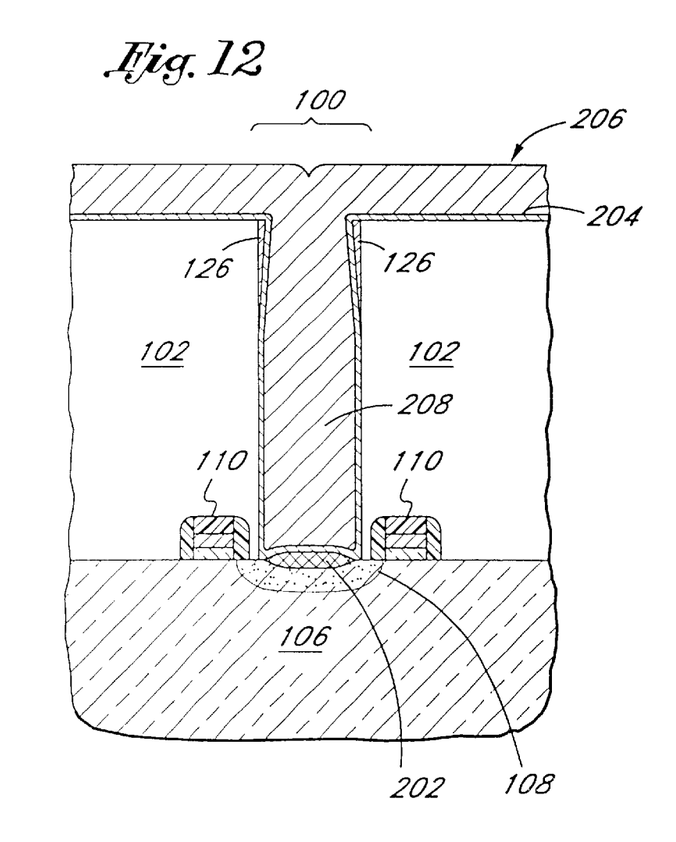
FIG. 12 illustrates the contact of FIG. 11 after annealing, depositing a barrier layer, and filling the contact.

FIG. 12 shows the wafer of FIG. 11 after an anneal step, a barrier layer deposition, a post-silicidation anneal step, and a contact fill step. These steps may be identical with the corresponding steps of the first preferred embodiment described above. Thus, after the viscous etch step of the second preferred embodiment, a silicide layer 202 is formed; a barrier layer 204, preferably comprising CVD TiN, is formed; and a filler material 206, preferably comprising CVD tungsten, is deposited into the contact 100. The above steps need not be performed in the order listed. A conductive plug 208 results without voids.

Figure 13:
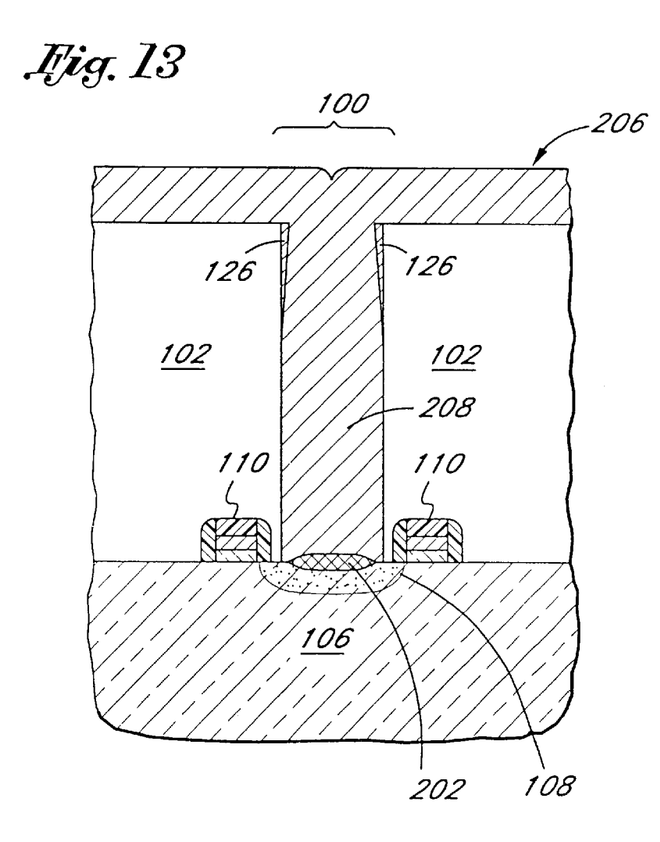
FIG. 13 illustrates the contact of FIG. 11 after an anneal and a contact fill.

An alternative version of the second embodiment is shown in FIG. 13 without a barrier layer, merely to illustrate that the barrier layer 202 of FIG. 12 is optional for all embodiments disclosed herein.

Figure 14:
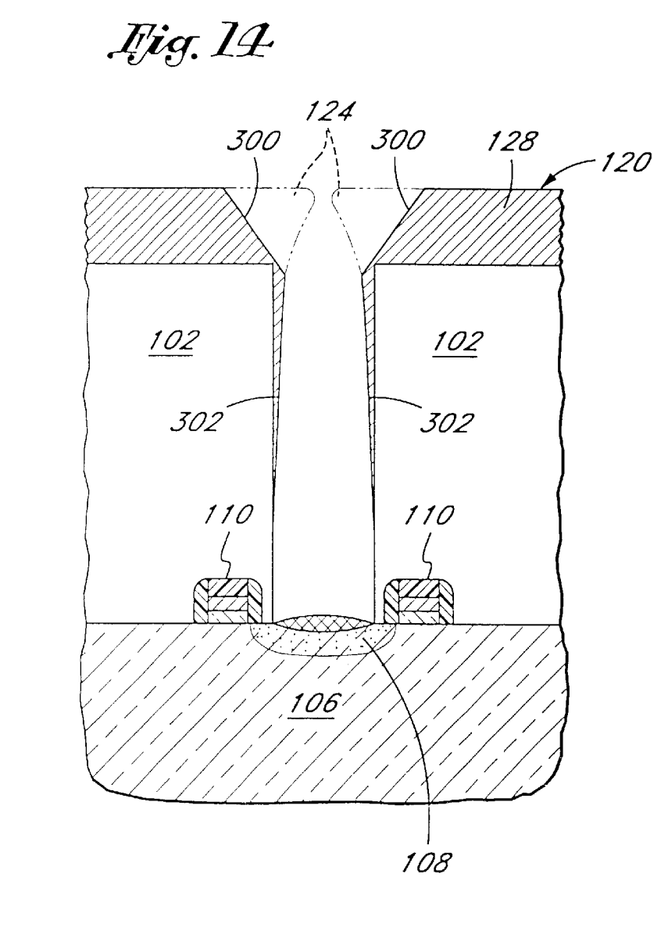
FIG. 14 illustrates the contact of FIG. 5 after a cusp removal, in accordance with a third preferred embodiment of the present invention.

FIG. 14 illustrates the cusp removal step of a third preferred embodiment of the present invention. A facet etch is performed on the structure of FIG. 5 to at least partially remove the cusp 124 of the initial conductive layer 120. Facet etch in general is known in the art, and has been used to slope oxide features within integrated circuits. A facet etch on titanium corners over metal-to-metal contacts is disclosed in a copending application of Roberts, et al., entitled "FACET ETCH FOR IMPROVED STEP COVERAGE OF INTEGRATED CIRCUIT CONTACTS," assigned Ser. No. 08/594,842, filed Jan. 31, 1996.

The facet etch should be performed by a physical process known as ion beam bombardment, or ion milling. High energy ions of a relatively non-reactive chemical, preferably a noble gas, are accelerated within a chamber and directed toward the wafer. Most preferably, an rf power source creates a plasma condition and argon ions ($Ar^+$) bombard the wafer within an RIE chamber. The etch, commonly known as an argon sputter etch, is enhanced by giving the wafer a negative bias with respect to the plasma. The electric field is naturally stronger at the cusp 124 of the initial conductive layer 120, attracting the positive argon ions and leading to preferential etch. A sloped facet 300 results, as illustrated in FIG. 14.

Preferred parameters for the argon sputter etch include an rf power between about 300 and 1,000 W, most preferably about 800 W, a pressure between about 5 and 40 mTorr, most preferably about 15 mTorr, and an argon flow between about 10 and 100 sccm, most preferably about 50 sccm.

As illustrated in FIG. 14, the material removed from the cusp 124 (FIG. 5) of the initial conductive layer 120 also acts as a sputter deposition target, so that at least some of the conductive material of the cusp 124 (FIG. 5) is re-deposited onto sidewalls of the contact 100 to form, in combination with the previous sidewall portion 126 of the initial conductive layer 120, an augmented sidewall portion 302 (FIG. 14). As mentioned, the drawings generally represent cross-sectional views of the contact 100 with the back wall omitted for simplicity. It will be understood, however, that material from every point of the cusp 124 all around the mouth of the contact 100 is sputtered to a point diagonally opposite along the contact sidewall, thus forming the augmented sidewall portion 302.

For the preferred embodiments, elemental titanium is etched from the cusp 124 of the initial conductive layer 120, and the titanium is sputtered to the sidewall. Thus, the augmented sidewall portion 302 provides additional conductive (Ti) coverage of the sidewall, which serves to improve adhesion of the tungsten plug to be deposited.

Figure 15:
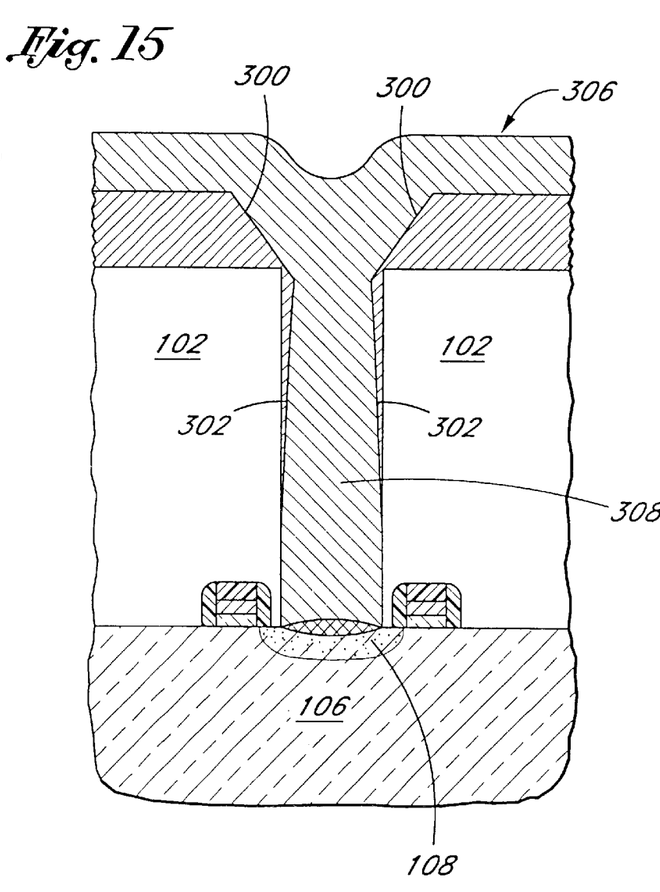
FIG. 15 illustrates the contact of FIG. 14 after an anneal and a contact fill.

FIG. 15 shows the wafer of FIG. 14 after a contact fill with conductive filler material 306. As with the previous embodiments, the contact fill preferably comprises a CVD step, and most preferably comprises the conformal deposition of tungsten to form a conductive plug 308. No barrier layer has been utilized, although it will be understood that a TiN layer may also have been formed prior to the contact fill step, as with the first preferred embodiment. Note that, since the augmented sidewall portion 302 may serve as an extended adhesion layer over the sidewall of insulating layer 102, one of the functions of a barrier layer is already fulfilled.

Although the foregoing invention has been described in terms of certain preferred embodiments, other embodiments will become apparent to those of ordinary skill in the art, in view of the disclosure herein. In particular, the sequence of steps may differ. For example, it will be understood that the cusp removal step may be performed at any time prior to a contact fill step. Furthermore, multiple cusp removal steps may be performed, with repeated depositions of initial conductive layers therebetween, prior to a fill step. Such a process may be necessary for extremely high-aspect ratio contacts which prevent sufficient Ti from forming at the substrate surface.

Accordingly, the present invention is not intended to be limited by the recitation of preferred embodiments, but is instead intended to be defined solely by reference to the appended claims.

We claim:

1. A method of forming an electrical contact between layers in an integrated circuit, comprising:
   opening a contact hole through an insulating layer to expose a circuit element;
   depositing an initial conductive layer to form direct contact with a top surface of the insulating layer and the exposed circuit element; and
   without filling the contact hole, removing a top portion of the initial conductive layer overlying the top surface of the insulating layer.

2. The method according to claim 1, further comprising filling the contact hole with a conductive filler material.

3. A method of forming electrical contact through an insulating layer to a semiconductor substrate of an integrated circuit, comprising:
   etching a contact hole to the substrate through the insulating layer with an aspect ratio greater than about 2:1;
   depositing a metal layer over the insulating layer and into the contact hole, forming a metal cusp at a lip of the contact hole;
   at least partially removing the metal cusp; and
   depositing a second conductive layer into the contact hole.

4. The method according to claim 3, wherein the contact hole has an aspect ratio greater than 4:1.

5. A method of filling a contact hole through an insulating layer in an integrated circuit, comprising:
   depositing an initial conductive layer into the contact hole and over the insulating layer, forming a void within the contact hole;
   mechanically planarizing a top portion of the initial conductive layer overlying the insulating layer; and
   filling the contact hole with a second conductive material after the planarizing step.

6. A method of forming a conductive contact in an integrated circuit, comprising:
   forming a contact hole through an insulating layer overlying a partially fabricated circuit;
   forming an initial conductive layer at the bottom of the contact hole and a top layer over the insulating layer;
   inverting the partially fabricated circuit over an absorbent pad soaked with a viscous etchant and thereby etching the top layer; and
   depositing a second conductive material into the contact hole after etching the top layer.

7. The method according to claim 6, wherein the viscous chemical consists of an etchant with a viscosity greater than about 1 mPa-s.

8. The method according to claim 7, wherein the viscous chemical consists of an etchant with a viscosity between about 2 mPa-s and 5 mPa-s.

9. The method according to claim 6, wherein the etchant comprises phosphoric acid.

10. The method according to claim 9, wherein the etchant comprises between about 40% and 50% phosphoric acid solution.

11. A method of forming electrical contact through an insulating layer to a semiconductor substrate of an integrated circuit, comprising:
    forming a contact hole through the insulating layer to expose an underlying active area of the substrate;
    depositing an initial metal layer by physical vapor deposition into the contact and over the insulating layer and into the contact, forming a metal cusp at a lip of the contact;
    at least partially removing the metal cusp using a facet etch;
    filling the contact with a second conductive material after the facet etch.

12. The method according to claim 11, wherein the facet etch comprises an argon sputter etch.

* * * * *

UNITED STATES PATENT AND TRADEMARK OFFICE
CERTIFICATE OF CORRECTION

PATENT NO. : 6,423,626 B1
DATED : July 23, 2002
INVENTOR(S) : Srinivasan et al.

It is certified that error appears in the above-identified patent and that said Letters Patent is hereby corrected as shown below:

Column 3,
Line 42, please replace "remolding" with -- removing --.

Signed and Sealed this

Thirtieth Day of September, 2003

JAMES E. ROGAN
*Director of the United States Patent and Trademark Office*